United States Patent
Yang

(10) Patent No.: US 8,143,882 B2
(45) Date of Patent: Mar. 27, 2012

(54) CURRENT MEASURING APPARATUS

(75) Inventor: Hung-Shen Yang, Taoyuan (TW)

(73) Assignee: HTC Corporation, Taoyuan, Taoyuan County (TW)

( * ) Notice: Subject to any disclaimer, the term of this patent is extended or adjusted under 35 U.S.C. 154(b) by 0 days.

(21) Appl. No.: 12/333,535

(22) Filed: Dec. 12, 2008

(65) Prior Publication Data

US 2009/0167292 A1  Jul. 2, 2009

(30) Foreign Application Priority Data

Dec. 26, 2007 (TW) ............................. 96150254 A

(51) Int. Cl.
*G01R 1/20* (2006.01)
*G01R 15/12* (2006.01)

(52) U.S. Cl. .................... 324/126; 324/522; 324/713

(58) Field of Classification Search ................ 324/126, 324/522, 713
See application file for complete search history.

(56) References Cited

U.S. PATENT DOCUMENTS

| | | | | |
|---|---|---|---|---|
| 4,994,733 A * | 2/1991 | Yasunaga | ...... | 324/115 |
| 5,426,360 A * | 6/1995 | Maraio et al. | ...... | 324/126 |
| 5,430,365 A * | 7/1995 | Taylor et al. | ...... | 323/273 |
| 6,147,484 A * | 11/2000 | Smith | ...... | 324/142 |
| 6,498,473 B1 * | 12/2002 | Yamabe | ...... | 324/158.1 |
| 7,098,648 B2 * | 8/2006 | Krieger et al. | ...... | 324/158.1 |
| 7,298,150 B2 * | 11/2007 | Amanuma | ...... | 324/522 |
| 2007/0182421 A1 * | 8/2007 | Janke et al. | ...... | 324/522 |
| 2008/0203942 A1 * | 8/2008 | Turpin et al. | ...... | 315/291 |

* cited by examiner

*Primary Examiner* — Huy Q Phan
*Assistant Examiner* — Emily Chan
(74) *Attorney, Agent, or Firm* — Muncy, Geissler, Olds & Lowe, PLLC

(57) ABSTRACT

A current measuring apparatus is disclosed. The current measuring apparatus comprises a power supply unit, an impedance setting module, and a current measuring unit. The power supply unit is adapted to provide an electric power to an electronic apparatus. The impedance setting module is adapted to provide at least one impedance value to the electronic apparatus so that the electronic apparatus is able to be activated in response to the electric power and the impedance value. The current measuring unit is adapted to show a current consumption value of the electronic apparatus under the activated state.

7 Claims, 3 Drawing Sheets

CURRENT MEASURING APPARATUS

This application claims priority to Taiwan Patent Application No. 096150254 filed on Dec. 26, 2007, the disclosure of which is incorporated herein by reference in its entirety.

CROSS-REFERENCES TO RELATED APPLICATIONS

Not applicable.

BACKGROUND OF THE INVENTION

1. Field of the Invention

The present invention provides a measuring apparatus that is expected to be widely applied to a variety of electronic apparatuses.

2. Descriptions of the Related Art

Due to the rapid development of technologies, a wide variety of lightweight and miniaturized electronic apparatuses have been present on the market. Various types of products with different functions, profiles and sizes, especially for handheld electronic apparatuses such as mobile phones, personal digital assistants (PDAs) and the like, have been developed to satisfy consumers' needs for diversified products. Generally, to ensure the quality of such handheld electronic apparatuses, the current consumption of an internal mainboard thereof is usually measured during the manufacturing process to test for abnormal statuses and to ensure that the current consumption of the mainboard complies with the specifications of the product under various service conditions. However, due to the wide varieties of such products, manufacturers are required to design various test instruments to match the specifications and profiles of the corresponding products so as to meet test requirements during the manufacturing process.

Furthermore, after such handheld electronic apparatuses are sold to the consumers and the maintenance of the handheld electronic apparatuses are needed, the maintenance service suppliers who deal with the wide variety of products have to make different testing instruments to provide a complete and fast after-sales services. Take mobile phones for examples, there are many different design specifications for one manufacturer. Consequently, due to the different design specifications of the main batteries' resistance settings and the signal pin arrangement of different products, the maintenance staff will still have to make specific testing instruments according to the different product specifications in order to make a rapid measurement on the current consumption values thereof without having to dismount the casing.

In view of the above, it is highly desirable in this industry to make an appropriate testing instrument that can satisfy the test requirements of various electronic products to allow the rapid maintenance and reduce the cost otherwise needed to make different testing instruments.

SUMMARY OF THE INVENTION

This invention provides a current measuring apparatus that simulate batteries used in various electronic apparatuses to measure the current consumption value under an activated state of several kinds of electronic apparatuses with different specifications.

This invention discloses a current measuring apparatus for measuring the current consumption value under the activated state of an electronic apparatus. The current measuring apparatus comprises a power supply unit, an impedance setting module and a current measuring unit. The power supply unit is electrically connected to the electronic apparatus, and is adapted to provide electric power to the electronic apparatus. The impedance setting module is electrically connected to the electronic apparatus, and is adapted to provide at least one impedance value to the electronic apparatus, thereby activating the electronic apparatus in response to the electric power and the impedance value. The current measuring unit is electrically connected to the power supply unit and the electronic apparatus respectively, and is adapted to show the current consumption value of the electronic apparatus under the activated state.

In an embodiment of this invention, the current measuring apparatus comprises a clamping unit, which is adapted to be assembled with and electrically connected to the electronic apparatus. The power supply unit, the impedance setting module and the current measuring unit are respectively electrically connected to the electronic apparatus through the clamping unit.

In an embodiment of this invention, the impedance setting module comprises an impedance modulator, which is adapted to provide at least one impedance value to the electronic apparatus.

In an embodiment of this invention, the impedance setting module comprises a resistance modulator, which is adapted to provide at least one resistance value to the electronic apparatus.

In an embodiment of this invention, the impedance setting module comprises a plurality of resistors, while the resistance modulator selects one of the resistors to output at least one resistance value.

In an embodiment of this invention, the resistance value is a temperature-identification resistance value.

In an embodiment of this invention, the resistance value is a module-identification resistance value.

In an embodiment of this invention, the power supply unit is a direct current (DC) power supply module, and the electric power is a DC electric power.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

This invention will now be explained with reference to several embodiments thereof, all of which relate to the current measuring apparatus 1. The current measuring apparatus 1 is capable of outputting different impedance values to simulate batteries used in electronic apparatuses with different specifications and activating the electronic apparatus 20 for testing. Then, the current consumption value of the electric apparatus 20 is measured to check for any abnormal conditions therein. More specifically, since different electronic apparatuses 20 use batteries of different specifications, at least one resistance setting is adopted in such a battery to avoid damage to the electronic apparatus 20 from use of an inappropriate battery.

The electronic apparatus 20 may commence operation only after it detects a specific resistance setting. The current measuring apparatus 1 of this invention is capable of outputting different impedance values (including resistance values, capacitance values, inductance values, or a combination thereof) to simulate batteries used in various electronic apparatuses 20. In this way, the current measuring apparatus 1 of this invention is able to measure the current consumption values of different electronic apparatuses 20. However, these embodiments are not intended to limit this invention to any specific context, applications or particular methods described in these embodiments. Therefore, the description of these embodiments is only intended to illustrate rather than to limit this invention. It should be noted that in the following embodiments and attached drawings, the elements not directly related to this invention are omitted. For ease of understanding, the dimensional relationships among the individual elements are depicted in an exaggerated way.

Figure 1:
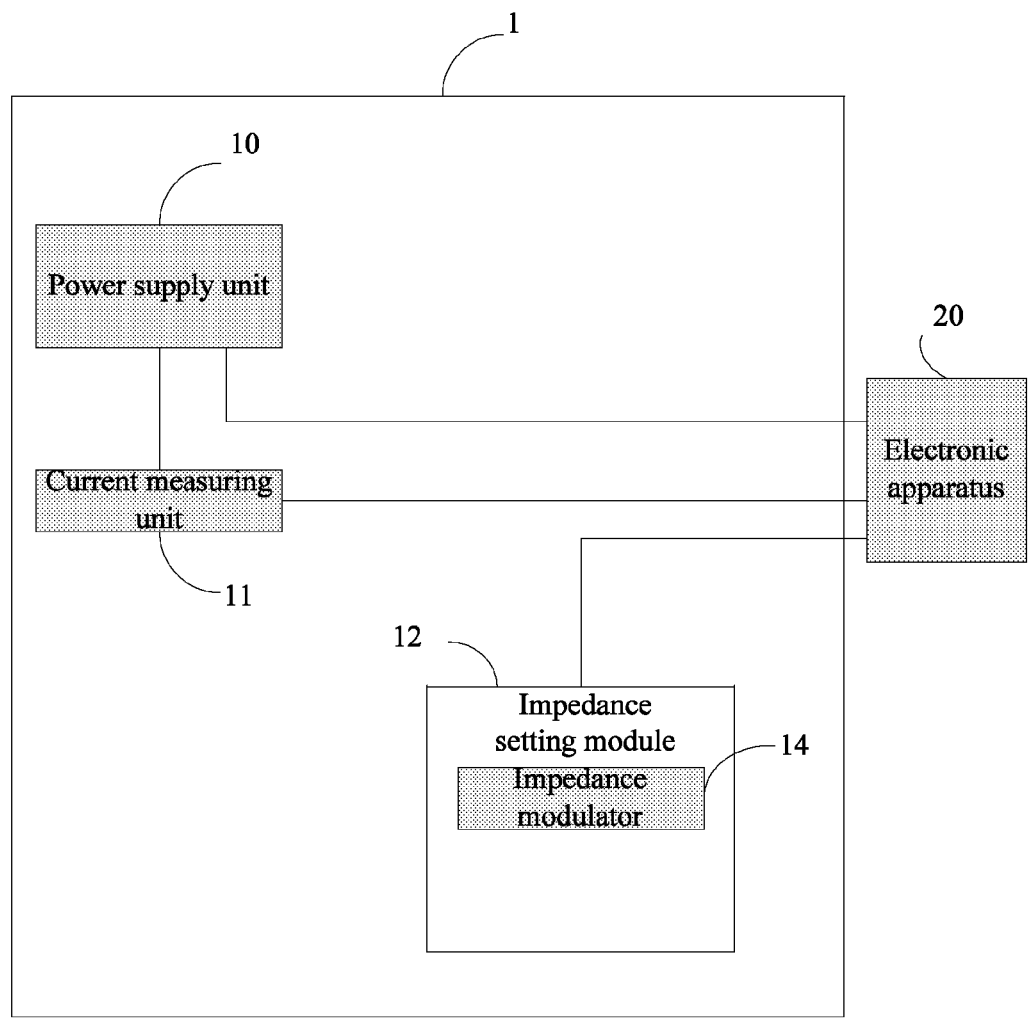
FIG. 1 illustrates the first embodiment of this invention.

The first embodiment of this invention is depicted in FIG. 1, which primarily illustrates the modules inside the current measuring apparatus 1 and the connections between the current measuring apparatus 1 and the electronic apparatus 20. In this embodiment, the current measuring apparatus 1 comprises a power supply unit 10, a current measuring unit 11 and an impedance setting module 12. The electronic apparatus 20 in this embodiment is a handheld electronic apparatus, such as a mobile phone, a PDA or the like. However, this invention is not just limited thereto. Any electronic apparatus that uses a battery as a power supply and requires maintenance may be measured by the current measuring apparatus 1 of this invention.

In this embodiment, the power supply unit 10 is adapted to supply a power supply to the electronic apparatus 20. Here, the power supply may be a direct-current (DC) power supply, and the power supply unit 10 is a DC power supply module. In more detail, the power supply unit 10 is configured to supply a current to the current measuring unit 11. The current is then inputted to the electronic apparatus 20 to supply the power necessary to activate the electronic apparatus 20. The impedance setting module 12, which is electrically connected to the electronic apparatus 20, is configured to provide at least one impedance value to the electronic apparatus 20 to be tested, so that the electronic apparatus 20 is activated in response to the power supply from the power supply unit 10 and the impedance value provided by the impedance setting module 12. Furthermore, the current measuring unit 11, which may be an ampere meter, is configured to measure the current value flowing to the electronic apparatus 20. More specifically, the current measuring unit 11 is configured to display the current consumption value of the electronic apparatus 20 under the activated state to check for any abnormal conditions caused by the electronic apparatus 20 and/or the battery. In other words, according to the information displayed by the current measuring unit 11, the measurement and maintenance staff may diagnose potential issues of the electronic apparatus 20 promptly and take measures for proper and prompt maintenance.

The impedance value may consist of a resistance value, a capacitance value, an inductance value, or a combination thereof. Furthermore, the impedance setting module 12 may also comprise an impedance modulator 14, which is able to output different impedance values according to the different electronic apparatuses 20. Hereinafter, an example in which the impedance setting module 12 outputs a resistance value will be described.

Figure 2:
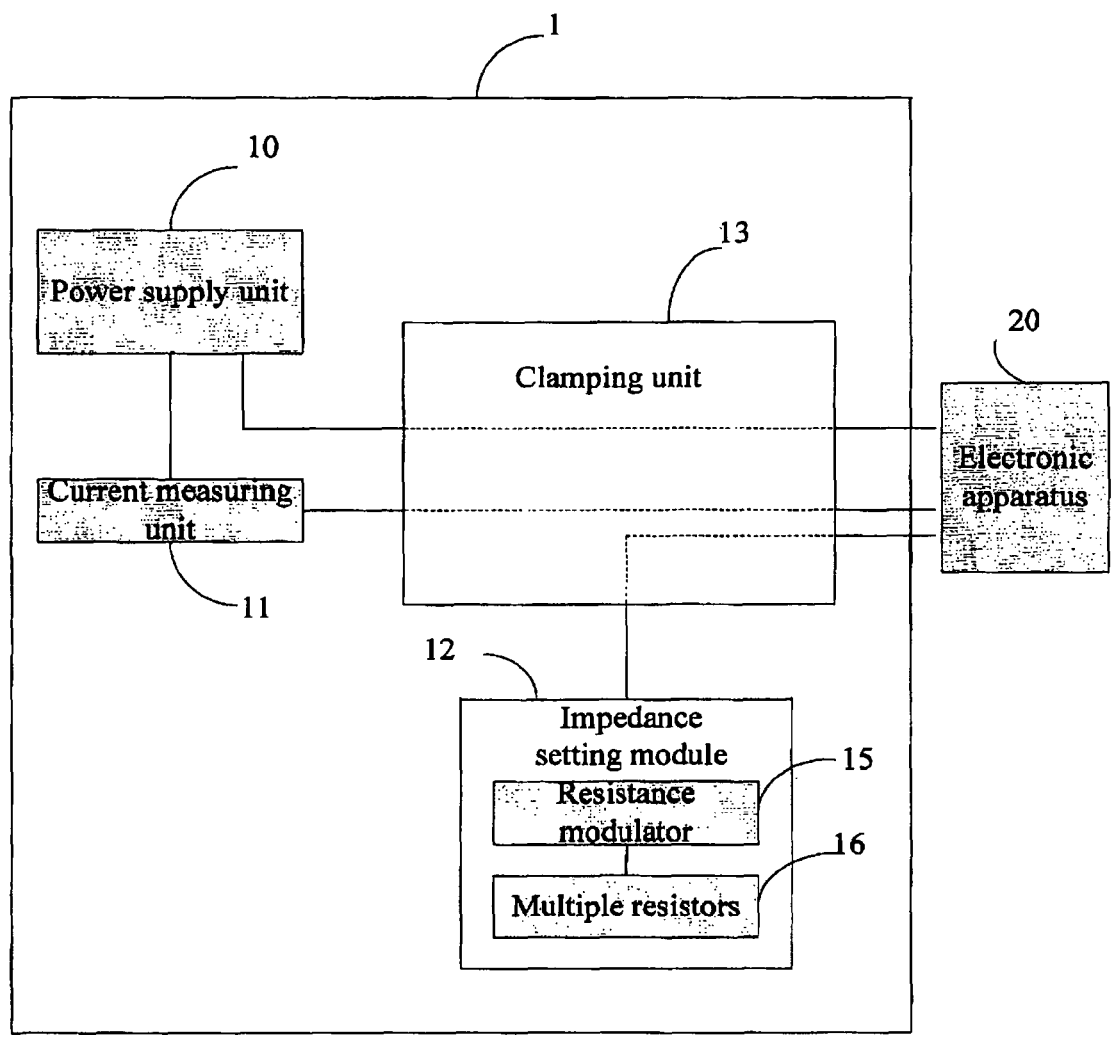
FIG. 2 illustrates the second embodiment of this invention.

FIG. 2 depicts a current measuring apparatus 1 in accordance with another embodiment of this invention, which is generally the same as that of the first embodiment. The current measuring apparatus 1 also comprises a power supply unit 10, a current measuring unit 11 and an impedance setting module 12. The detailed functions and connections of which are just as described in the first embodiment and thus will not be described again herein. This embodiment differs from the first embodiment in that the current measuring apparatus 1 of this embodiment further has a clamping unit 13 to secure a stable electrical connection with the electronic apparatus 20.

More specifically, the clamping unit 13 is adapted to be connected with the electronic apparatus 20, while the impedance setting module 12, the power supply unit 10 and the current measuring unit 11 are all electrically connected to the electronic apparatus 20 via the clamping unit 13. In particular, the clamping unit 13 may have several contacts for electrically connecting to the counterparts in the electrical apparatus 20 for connecting to the battery of the electrical apparatus 20. It should be emphasized that the impedance setting module 12, the power supply unit 10 and the current measuring unit 11 may also be electrically connected to the electronic apparatus 20 directly via wires. Furthermore, to facilitate the wide application of this invention to various electronic apparatuses with different sizes and profiles, the clamping unit 13 may vary widely in terms of the configuration thereof, thereby accommodating the different design specifications of various electronic apparatuses.

Figure 3:
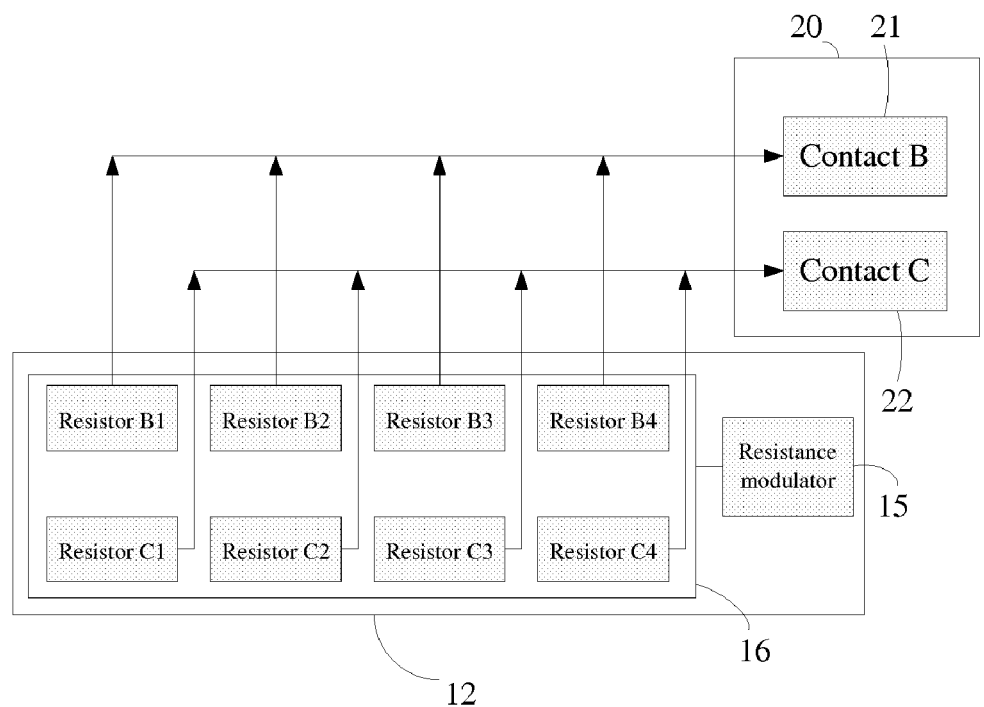
FIG. 3 illustrates the impedance setting module in the second embodiment of this invention.

To be more specific, referring to FIG. 3 with the aforementioned figures, the impedance setting module 12 of this embodiment comprises a resistance modulator 15 and multiple resistors 16, namely, resistors B1~B4 and C1~C4. Each of the resistors 16 has a predetermined resistance value for a resistance setting purpose. Furthermore, in response to a request from the user, the resistance modulator 15 modulates the multiple resistors 16 into the desired resistance value complying with built-in specifications of a corresponding electronic apparatus 20, and transmits the resistance value to the electronic apparatus 20.

When the battery has four contacts, two of the contacts are configured to output a temperature-identification resistance value and a module-identification resistance value respectively. In this case, when the electronic apparatus 20 detects that two sets of resistance values are the setting values, the electronic apparatus 20 starts to operate. The temperature-identification resistance value is typically associated with the safe operational temperature of the electronic apparatus, while the module-identification resistance value is typically built in by the manufacturer for the identification of the electronic apparatus.

As described above, when the built-in resistance setting of the battery used in the electronic apparatus 20 comprises a temperature-identification resistance value and a module-identification resistance value, the resistance modulator 15 may sequentially modulate the predetermined resistance values of the resistors 16 according to the temperature-identification and module-identification resistance settings respectively to generate the resistance values equal to the settings of the electronic apparatus 20. The resistance values thus generated are inputted to the electronic apparatus 20 to activate the apparatus 20 for subsequent functional testing. Alternatively, in other embodiments, the resistance modulator 15 may directly choose ones of the predetermined resistance values of the resistors 16 that are equal to the resistance settings of the electronic apparatus 20, respectively. In this case, the chosen resistance values are provided directly to the electronic apparatus 20 to activate the apparatus 20 for subsequent testing. For example, if the electronic apparatus 20 has four contacts, two of the contacts are connected to the power supply unit 10 and the current measuring unit 11 respectively, while the other two contacts (e.g., contacts B and C) are configured to detect the temperature-identification resistance value and the module-identification resistance value of the battery, respectively. In other words, the impedance setting module 12 outputs two resistance values to the contacts B and C respectively.

For example, if a battery used in a certain electronic apparatus has a temperature-identification and a module-identification resistance setting of 10 kΩ and 120 kΩ respectively, the impedance setting module 12 may enable the resistance modulator 15 to change the equivalent resistance of a combination of the resistors B1~B4 to be 10 kΩ according to the user's request, and then provides the resultant resistance to the contact B for temperature-identification sensing. On the other hand, the resistance modulator 15 changes the equivalent resistance of a combination of the resistors C1~C4 to be 120 kΩ and provides the resultant resistance to the contact C for module-identification sensing. As can be appreciated by those skilled in the art, the number and functions of the pins described above are only intended to illustrate rather than to limit this invention.

It follows from the above description that the current measuring apparatus of this embodiment provides a power supply and at least one adjustable resistance value simulating the different batteries to the electronic apparatus, thereby activating the electronic apparatus to measure the current consumption value thereof. Therefore, the current measuring apparatus of this invention demonstrates high commonality, and can be widely applied to current detecting operations involving electronic apparatuses of different types, sizes and profiles.

With this invention, various impedance values (including resistance values, capacitance values, inductance values, or a combination thereof) can be outputted to simulate batteries that are used in various electronic apparatuses, so that the electronic apparatuses can be activated and the current consumption values thereof be measured under an activated state. As a result, the testing cost is reduced.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A current measuring apparatus for measuring a current consumption value of an electronic apparatus under an activated state, the current measuring apparatus comprising:
   a direct current power supply module, electrically connected to the electronic apparatus, adapted to provide a DC electric power to the electronic apparatus;
   an impedance setting module, electrically connected to the electronic apparatus, the impedance setting module comprising a plurality of resistors and an resistance modulator selecting one of the resistors to output the at least one resistance value, wherein the impedance setting module is adapted to provide at least one adjustable impedance value to the electronic apparatus so that the electronic apparatus activates in response to the electric power and the at least one adjustable impedance value;
   a current measuring unit, electrically connected to the direct current power supply module and the electronic apparatus, respectively, the current measuring unit being adapted to show the current consumption value of the electronic apparatus under the activated state; and
   a clamping unit, assembled with and electrically connected to the electronic apparatus, and the direct current power supply module, the impedance setting module and the current measuring unit being electrically connected to the electronic apparatus through the clamping unit, respectively.

2. The current measuring apparatus as claimed in claim 1, wherein the impedance setting module comprises:
   an impedance modulator, adapted to provide at least one impedance value to the electronic apparatus.

3. The current measuring apparatus as claimed in claim 1, wherein the resistance modulator is adapted to provide at least one resistance value to the electronic apparatus.

4. The current measuring apparatus as claimed in claim 3, wherein the least one resistance value is a temperature-identification resistance value.

5. The current measuring apparatus as claimed in claim 3, wherein the at least one resistance value is a module-identification resistance value.

6. The current measuring apparatus as claimed in claim 1, wherein the impedance setting module provides the adjustable impedance values which values are greater than zero.

7. The current measuring apparatus as claimed in claim 6, wherein the impedance setting module provides the at least one adjustable impedance value while the current measuring apparatus is turned on and operational.

* * * * *